(12) United States Patent
Albrecht et al.

(10) Patent No.: US 9,566,687 B2
(45) Date of Patent: Feb. 14, 2017

(54) CENTER FLEX SINGLE SIDE POLISHING HEAD HAVING RECESS AND CAP

(71) Applicant: SunEdison Semiconductor Limited (UEN201334164H), Singapore (SG)

(72) Inventors: Peter Albrecht, O'Fallon, MO (US); Sumeet Bhagavat, St. Charles, MO (US); Alex Chu, Hsinchu (TW); Ichiro Yoshimura, Shimotsuke (JP); Yunbiao Xin, Palo Alto, CA (US); Roland Vandamme, Wentzville, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 39 days.

(21) Appl. No.: 14/512,779

(22) Filed: Oct. 13, 2014

(65) Prior Publication Data

US 2016/0101502 A1 Apr. 14, 2016

(51) Int. Cl.
*B24B 7/22* (2006.01)
*B24B 37/30* (2012.01)
*H01L 21/67* (2006.01)

(52) U.S. Cl.
CPC .......... *B24B 37/30* (2013.01); *H01L 21/67092* (2013.01)

(58) Field of Classification Search
CPC .......................................................... B24B 7/22
USPC .......... 451/287, 288, 289, 290, 398, 388, 41
See application file for complete search history.

(56) References Cited

U.S. PATENT DOCUMENTS

| | | | |
|---|---|---|---|
| 5,664,989 A | 9/1997 | Nakata et al. | |
| 5,964,653 A | 10/1999 | Perlov et al. | |
| 6,056,632 A * | 5/2000 | Mitchel | B24B 37/32 451/286 |
| 6,162,116 A | 12/2000 | Zuniga et al. | |
| 6,165,056 A | 12/2000 | Hayashi et al. | |
| 6,273,803 B1 * | 8/2001 | Wang | B24B 37/32 451/288 |
| 6,623,343 B2 * | 9/2003 | Kajiwara | B24B 37/30 451/288 |
| 6,722,965 B2 * | 4/2004 | Zuniga | B24B 49/16 451/285 |
| 6,893,327 B2 | 5/2005 | Kajiwara et al. | |
| 8,088,299 B2 | 1/2012 | Chen et al. | |
| 8,092,281 B2 | 1/2012 | Masumura et al. | |
| 2003/0124963 A1 * | 7/2003 | Zuniga | B24B 37/30 451/289 |
| 2007/0207709 A1 | 9/2007 | Berkstresser et al. | |
| 2008/0188167 A1 | 8/2008 | Ishii et al. | |
| 2010/0210192 A1 | 8/2010 | Masumura et al. | |

OTHER PUBLICATIONS

International Search Report and Written Opinion regarding International App. No. PCT/US2015/054033, dated Apr. 11, 2016, 15 pages.

* cited by examiner

*Primary Examiner* — Robert Rose
(74) *Attorney, Agent, or Firm* — Armstrong Teasdale LLP

(57) ABSTRACT

A polishing head assembly for single side polishing of silicon wafers is provided. The polishing head assembly includes a polishing head and a cap. The polishing head has a recess along a bottom portion, the recess having a recessed surface. The cap is positioned within the recess, and has an annular wall and a floor extending across the annular wall. The floor is spaced from the recessed surface to form a chamber therebetween. The chamber is configured to be pressurized for deflecting the floor. The annular wall is attached to the polishing head with an adhesive.

22 Claims, 10 Drawing Sheets

CENTER FLEX SINGLE SIDE POLISHING HEAD HAVING RECESS AND CAP

FIELD

This disclosure relates generally to polishing of semiconductor or solar wafers and more particularly to single side polishing apparatus and methods for controlling flatness of the wafer.

BACKGROUND

Semiconductor wafers are commonly used in the production of integrated circuit (IC) chips on which circuitry are printed. The circuitry is first printed in miniaturized form onto surfaces of the wafers. The wafers are then broken into circuit chips. This miniaturized circuitry requires that front and back surfaces of each wafer be extremely flat and parallel to ensure that the circuitry can be properly printed over the entire surface of the wafer. To accomplish this, grinding and polishing processes are commonly used to improve flatness and parallelism of the front and back surfaces of the wafer after the wafer is cut from an ingot. A particularly good finish is required when polishing the wafer in preparation for printing the miniaturized circuits on the wafer by an electron beam-lithographic or photolithographic process (hereinafter "lithography"). The wafer surface on which the miniaturized circuits are to be printed must be flat. Similarly, flatness and finish are also important for solar applications.

The construction and operation of conventional polishing machines contribute to the unacceptable flatness parameters. Polishing machines typically include a circular or annular polishing pad mounted on a turntable or platen for driven rotation about a vertical axis passing through the center of the pad and a mechanism for holding the wafer and forcing it into the polishing pad. The wafer is typically mounted to the polishing head using for example, liquid surface tension or a vacuum/suction. A polishing slurry, typically including chemical polishing agents and abrasive particles, is applied to the pad for greater polishing interaction between the polishing pad and the surface of the wafer. This type of polishing operation is typically referred to as chemical-mechanical polishing (CMP).

During operation, the pad is rotated and the wafer is brought into contact with and forced against the pad by the polishing head. As the pad wears, e.g., after a few hundred wafers, wafer flatness parameters degrade because the pad is no longer flat, but instead has a worn annular band forming a depression along the polishing surface of the pad. Such pad wear impacts wafer flatness, and may cause "dishing" or "doming" or a combination thereof resulting in a "w-shape".

When the flatness of the wafers becomes unacceptable, the worn polishing pad has to be replaced with a new one. Frequent pad replacement adds significant costs to the operation of the polishing apparatus not only because of the number of pads that need to be purchased, stored, and disposed of, but also because of the substantial amount of down time required to change the polishing pad.

Accordingly, there is a need for a polishing apparatus that has the ability to optimize flatness parameters by modulating the wafer thickness shape in the polishing process for doming, dishing, and +/− w-shape.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a polishing head assembly for single side polishing of silicon wafers is provided. The polishing head assembly includes a polishing head and a cap. The polishing head has a recess along a bottom portion, the recess having a recessed surface. The cap is positioned within the recess, and has an annular wall and a floor extending across the annular wall. The floor is spaced from the recessed surface to form a chamber therebetween. The chamber is configured to be pressurized for deflecting the floor. The annular wall is attached to the polishing head with an adhesive.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Generally, and in one embodiment of the present disclosure, a wafer that has previously been rough polished so that it has rough front and back surfaces is first subjected to an intermediate polishing operation in which the front surface of the wafer, but not the back surface, is polished to improve flatness parameters or to smooth the front surface and remove handling scratches. To carry out this operation, the wafer is placed against the polishing head. In this embodiment, the wafer is retained in position against the polishing head by surface tension. The wafer also is placed on a turntable of a machine with the front surface of the wafer contacting the polishing surface of a polishing pad.

A polishing head mounted on the machine is capable of vertical movement along an axis extending through the wafer. While the turntable rotates, the polishing head is moved against the wafer to urge the wafer toward the turntable, thereby pressing the front surface of the wafer into polishing engagement with the polishing surface of the polishing pad.

A conventional polishing slurry containing abrasive particles and a chemical etchant is applied to the polishing pad. The polishing pad works the slurry against the surface of the wafer to remove material from the front surface of the wafer, resulting in a surface of improved smoothness. As an example, the intermediate polishing operation preferably removes less than about 1 micron of material from the front side of the wafer.

The wafer is then subjected to a finish polishing operation in which the front surface of the wafer is finish polished to remove fine or "micro" scratches caused by large size colloidal silica, such as Syton® from DuPont Air Products Nanomaterials, LLC, in the intermediate step and to produce a highly reflective, damage-free front surface of the wafer. The intermediate polishing operation generally removes more of the wafer than the finishing polishing operation. The wafer may be finish polished in the same single-side polishing machine used to intermediate polish the wafer as described above. However, a separate single-side polishing machine may also be used for the finish polishing operation. A finish polishing slurry typically has an ammonia base and a reduced concentration of colloidal silica is injected between the polishing pad and the wafer. The polishing pad works the finish polishing slurry against the front surface of the wafer to remove any remaining scratches and haze so that the front surface of the wafer is generally highly-reflective and damage free.

Figure 1:
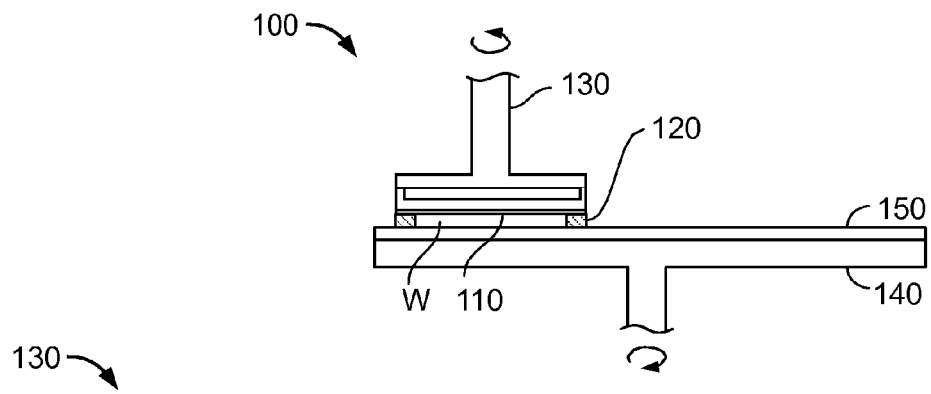
FIG. 1 is a partially schematic elevation of a single side polisher.

Referring to FIG. 1, a portion of a single side polishing apparatus is shown schematically and indicated generally at 100. The single side polisher 100 may be used to polish a front surface of semiconductor wafers W. It is contemplated that other types of single side polishing apparatus may be used.

The polishing apparatus 100 includes a wafer holding mechanism, e.g., a backing film 110, a retaining ring 120, a polishing head assembly 130, and a turntable 140 having a polishing pad 150. The backing film 110 is located between a polishing head assembly 130 and the retaining ring 120, which receives a wafer W. The retaining ring 120 has at least one circular opening to receive the wafer W to be polished therein. The wafer W of this embodiment is retained against the polishing head assembly 130 by surface tension.

The polishing apparatus 100 applies a force to the polishing head assembly 130 to move the polishing head assembly vertically to raise and lower the polishing head assembly 130 with respect to the wafer W and the turntable 140. An upward force raises the polishing head assembly 130, and a downward force lowers the polishing head assembly. As discussed above, the downward vertical movement of the polishing head assembly 130 against the wafer W provides the polishing pressure to the wafer to urge the wafer into the polishing pad 150 of the turntable 140. As the polishing apparatus 100 increases the downward force, the polishing head assembly 130 moves vertically lower to increase the polishing pressure.

A portion of the polishing head assembly 130 and polishing pad 150 and turntable 140 are rotated at selected rotation speeds by a suitable drive mechanism (not shown) as is known in the art. The rotational speeds of the polishing pad and the turntable may be the same or different. In some embodiments, the apparatus 100 includes a controller (not shown) that allows the operator to select rotation speeds for both the polishing head assembly 130 and the turntable 140, and the downward force applied to the polishing head assembly.

Figure 2:
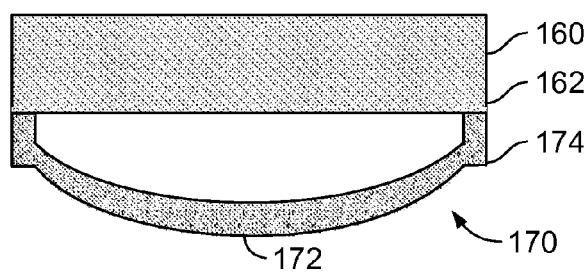
FIG. 2 is a cross section of a single side polishing head with a domed plate in accordance with one embodiment, the shape of the domed plate being exaggerated for illustration purposes.

With reference to FIG. 2, the polishing head assembly 130 includes a polishing head 160 and a cap 170. The cap is suitably made of plastic, aluminum, steel, ceramic, such as alumina or silicon carbide, or any suitable material with sufficient stiffness, including coated silicon.

The cap 170 includes a plate or floor 172 surrounded by an annular wall 174 extending upward therefrom. In a natural or un-deflected state, the floor 172 has a concave shape (relative to the chamber), such that the center of the floor is lower than the perimeter. The floor 172 is capable of temporarily deflecting without permanently deforming. The floor 172 is about 0.118 to about 0.275 inches (3-7 mm) thick, or about 0.625 inches (16 mm) thick for plastic, and has a diameter of about 5.905 to about 6.496 inches (150-165 mm).

The annular wall 174 is rigidly attached to and extends downward from an edge 162 of the polishing head 160.

Together the polishing head 160 and the cap 170 form a downwardly domed structure. The cap 170 may be attached to the polishing head 160 with bolts or other suitable fasteners. In other embodiments, an adhesive, such as an epoxy, is used to attach the cap 170 to the edge 162 of the polishing head 160.

Downward movement of the polishing head assembly 130 causes the cap 170 to contact the wafer W, and deflects the floor 172 upward toward the polishing head 160. The direction of deflection is perpendicular to the top surface of the wafer W.

As the polishing pressure of the cap 170 against the wafer W increases, the magnitude of deflection also increases. Regulation of the polishing pressure allows the deflection of the floor 172 to be increased or decreased. As the deflection of the floor 172 is changed, the shape of the floor is also changed.

Changing the shape of the floor 172 causes a resulting change in the force distribution of the polishing pressure across the wafer W and thereby causes the wafer to bend in response. The change in force distribution also causes a change in the rate of removal of material from the wafer W. Generally, the rate of removal is increased at portions of the wafer W that transfer relatively greater force to the polishing pad 150.

As a result, the downward force of the polishing head assembly 130 may be controlled to increase or decrease the deflection of the floor 172 of the cap 170 and thereby adjust the amount of doming or dishing of the wafer. As the polishing pressure is increased, the floor 172 transitions from a natural, un-deflected or downwardly curved shape to a flat shape that is substantially parallel with a bottom surface of the polishing head 160, and finally to an upwardly curved or convex shape.

Figure 3:
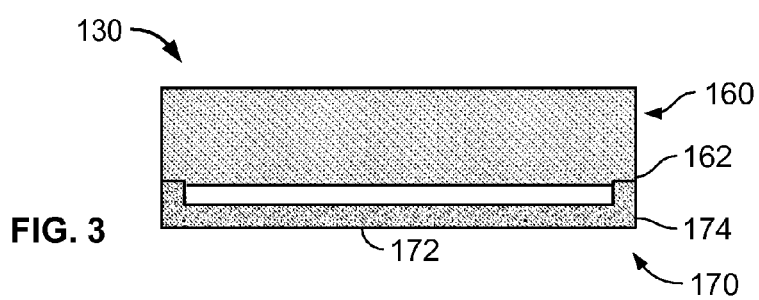
FIG. 3 is a cross section of the single side polishing head of FIG. 3 under polishing pressure.
Figure 4:
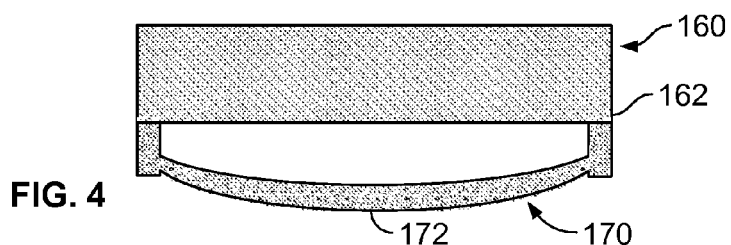
FIG. 4 is a cross section of the single side polishing head of FIG. 3 under polishing pressure 0.9 P.
Figure 5:
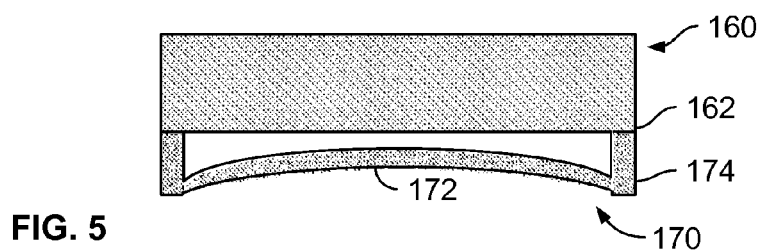
FIG. 5 is a cross section of the single side polishing head of FIG. 3 under polishing pressure 1.1 P.

As shown in FIG. 3, under a given or predetermined polishing pressure P the floor 172 is deflected to be substantially flat, resulting in a removal profile that is also substantially flat. As shown in FIG. 4, lowering the polishing pressure 0.9 P causes both the floor 172 and the removal profile to become downwardly curved. As shown in FIG. 5, increasing the polishing pressure 1.1 P causes both the shape of the floor 172 and the removal profile to become dished. Suitably, the change in polishing pressure may range from about 0.7 P to about 1.3 P. Thus, a change in polishing pressure P provides an operator with a control variable and the ability to adjust the polished shape of the wafer W. In some embodiments, the predetermined polishing pressure may range from 1.0 psi to 4.0 psi. In other embodiments, the predetermined polishing pressure may be less than 6.0 psi.

In some embodiments, the domed shaped plate may be attached to an existing polishing head so as to change the polishing properties of the polisher without extensively reworking the machine or buying a new machine.

Figure 6:
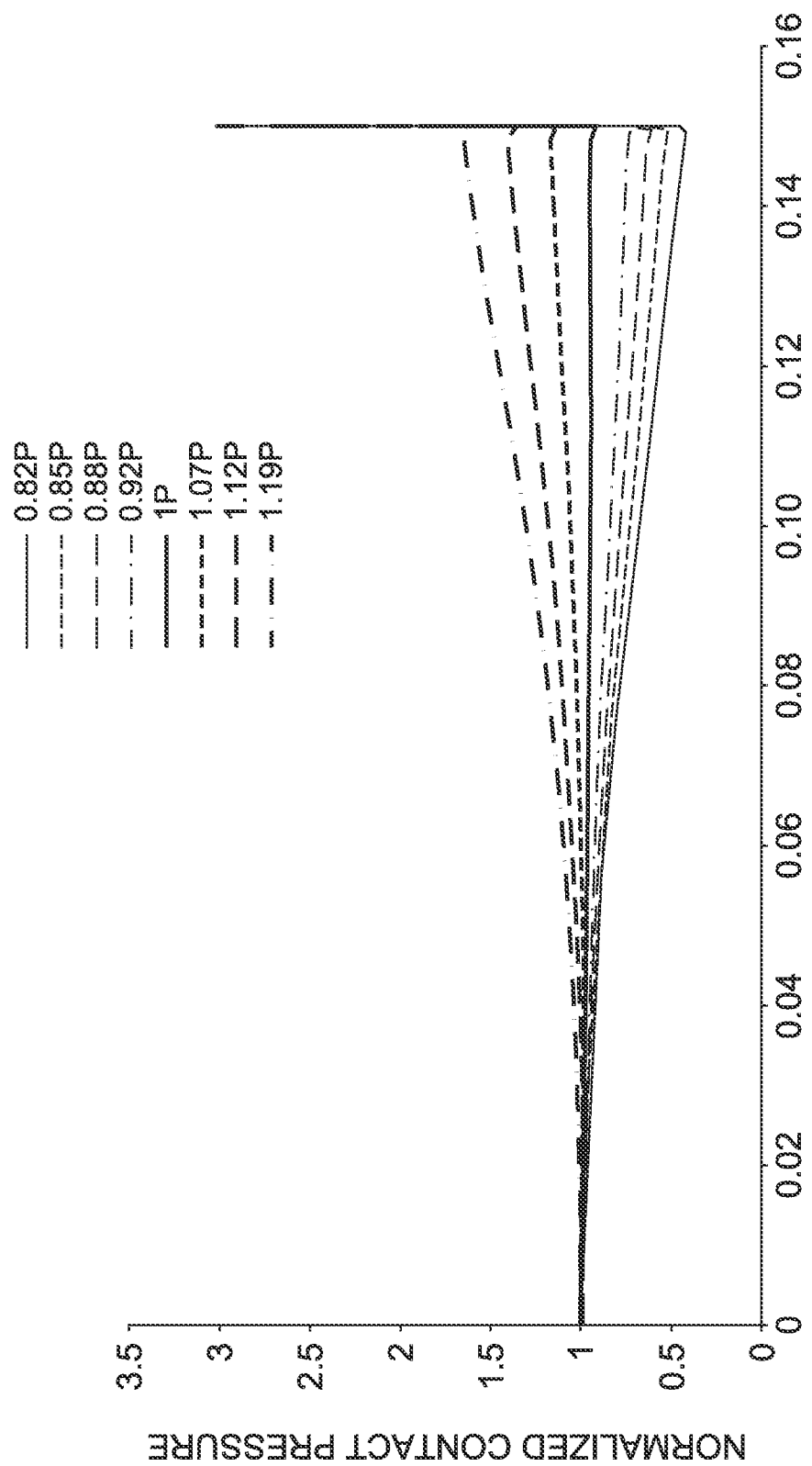
FIG. 6 is a pressure profile graph plotting the correlation of the contact pressure and wafer radius.

With reference to FIG. 6, a plot of a finite element simulation showing the correlation between the contact pressure and the radius are shown. This plot illustrates the ability of this embodiment to modulate the contact pressure profile by increasing or decreasing the standard polishing pressure P resulting in an adjustment of the removal profile.

Figure 7:
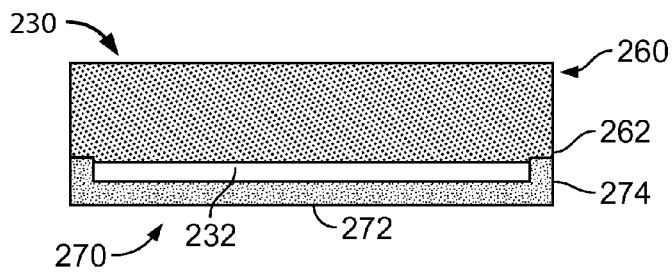
FIG. 7 is a cross section of a single side polishing head with a flat plate in accordance with another embodiment.

With reference to FIG. 7, another embodiment of the polishing head assembly 230 has a polishing head 260 and a cap 270. The cap 270 includes a floor 272 surrounded by an annular wall 274. The floor 272 is substantially flat in an initial or un-deflected state. The annular wall 274 is rigidly attached to and extends downward from an edge 262 of the polishing head 260 to form a chamber 232 between the floor 272 and the polishing head 260. The chamber 232 may be connected with a pressurizing source (not shown) to provide a pressurizing media or fluid to the chamber 232.

Figure 8:
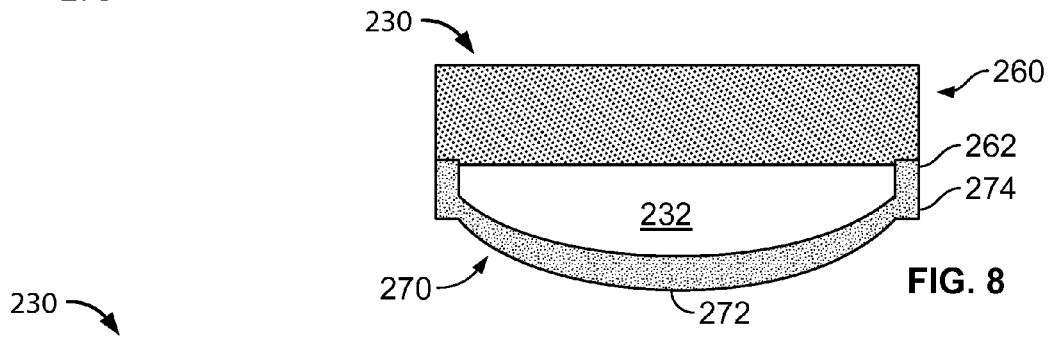
FIG. 8 is a cross section of the single side polishing head of FIG. 7 with a pressurized section under no polishing pressure.

As shown in FIG. 8, the chamber 232 may be pressurized causing the floor 272 to deflect into a downward dome shape, similar to floor 172. The pressure within the chamber 232 does not need to be changed frequently. Therefore, it may be adjusted manually when the polishing head assembly 230 is mounted on the polishing apparatus 100. In some embodiments, the cap 270 may be used to retrofit an existing polishing head without the need to drill holes through the existing head or spindle for passage of air or fluid through the spindle and rotary unions.

Similar to the floor 172, the floor 272 of the cap 270 is adapted to temporarily deflect in a direction that is perpendicular to the polishing surface as the polishing pressure is increased. The cap is not permanently deflected or deformed by the pressure. The floor 272 transitions from a pressurized deflected or downwardly curved shape to a flat shape that is substantially parallel with a bottom surface of the polishing head 260, and finally to an upwardly curved or convex shape as the polishing pressure is increased.

Figure 9:
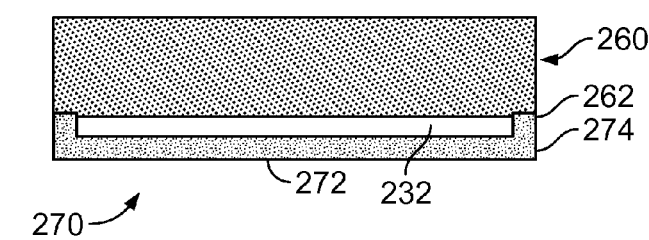
FIG. 9 is a cross section of the single side polishing head of FIG. 7 with a pressurized section under polishing pressure.
Figure 10:
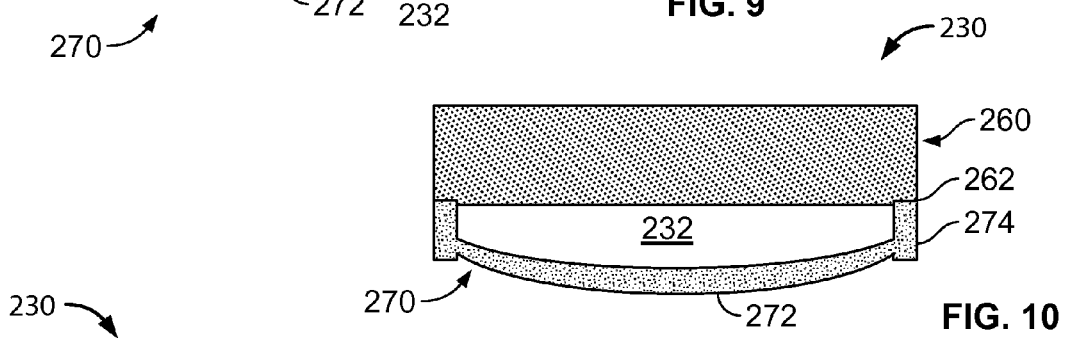
FIG. 10 is a cross section of the single side polishing head of FIG. 7 with a pressurized section under polishing pressure 0.9 P.
Figure 11:
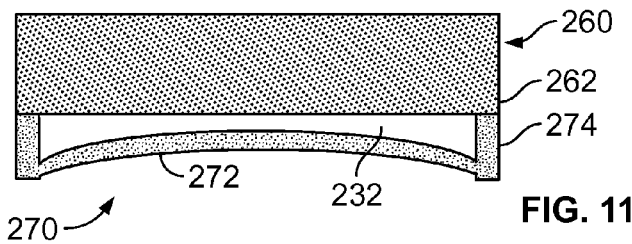
FIG. 11 is a cross section of the single side polishing head of FIG. 7 with a pressurized section under polishing pressure 1.1 P.

As shown in FIG. 9, under a given or predetermined polishing pressure P the floor 272 is deflected to be substantially flat, resulting in a removal profile that is also substantially flat. As shown in FIG. 10, lowering the polishing pressure 0.9 P causes both the floor 272 and the removal profile to become downwardly curved. As shown in FIG. 11, increasing the polishing pressure 1.1 P causes both the shape of the floor 272 and the removal profile to become dished. Thus, a change in polishing pressure P provides an operator the ability to adjust the polished shape of the wafer W.

As described above, the polishing system is capable of adjusting pressure distribution to control the shape of a polished wafer, e.g., for minimizing doming and dishing of the wafer after polishing.

Figure 12:
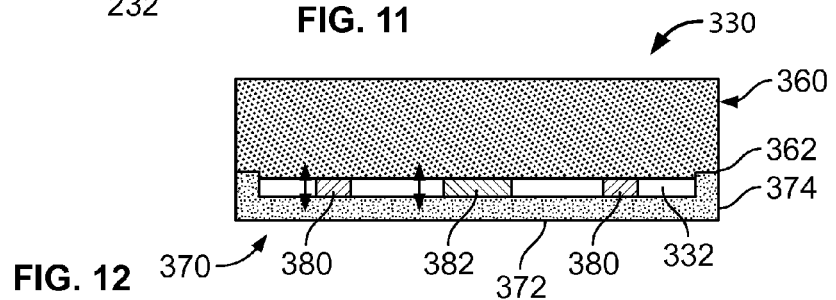
FIG. 12 is a cross section of a single side polishing head with a flat plate and two adjustable stoppers in accordance with another embodiment.

With reference to FIG. 12, another embodiment of the polishing head assembly 330 is adapted to adjust pressure distribution to a wafer during the polishing process for controlling or minimizing doming, dishing, and w-shape cross section of the wafer.

The polishing head assembly 330 has a polishing head 360, a cap 370, a stopper ring 380, and a center stopper 382. The cap 370 includes a floor 372 surrounded by an annular wall 374. The floor 372 is substantially flat in an initial or un-deflected state. The annular wall 374 is rigidly attached to and extends downward from an edge 362 of the polishing head 360 to form a chamber 332 between the floor 372 and the polishing head 360. The chamber 332 may be connected with a pressurizing source (not shown) to provide a pressurizing fluid to the chamber 332.

Figure 13:
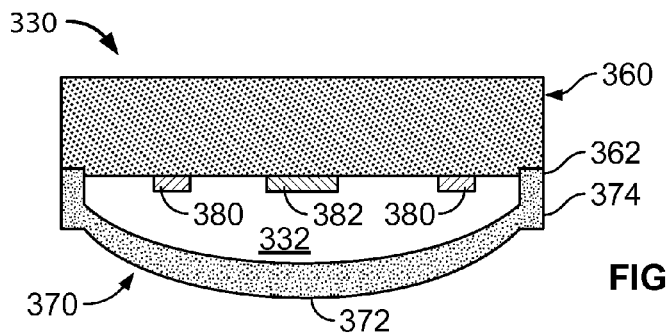
FIG. 13 is a cross section of the single side polishing head of FIG. 12 with a pressurized section under no polishing pressure.

As shown in FIG. 13, the chamber 332 may be pressurized causing the floor 372 to deflect into a downward dome shape, similar to floors 172 and 272. The pressure within the chamber 332 does not need to be changed frequently. Therefore, it may be adjusted manually when the polishing head assembly 330 is mounted on the polishing apparatus 100. In some embodiments, the cap 370 may be used to retrofit an existing polishing head without the need to drill holes through the existing head for passage of air or fluid through the spindle and rotary unions.

Similar to the floors 172 and 272, the floor 372 of the cap 370 is adapted to temporarily deflect in a direction that is perpendicular to the polishing surface as the polishing pressure P is increased. The cap is not permanently deflected or deformed by the pressure. The floor 372 transitions from a pressurized deflected or downwardly curved shape to a flat shape that is substantially parallel with a bottom surface of the polishing head 360, and finally to a upwardly curved or convex shape.

Figure 14:
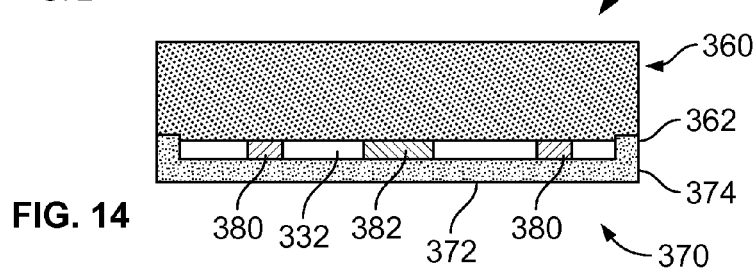
FIG. 14 is a cross section of the single side polishing head of FIG. 12 with a pressurized section under polishing pressure.
Figure 15:
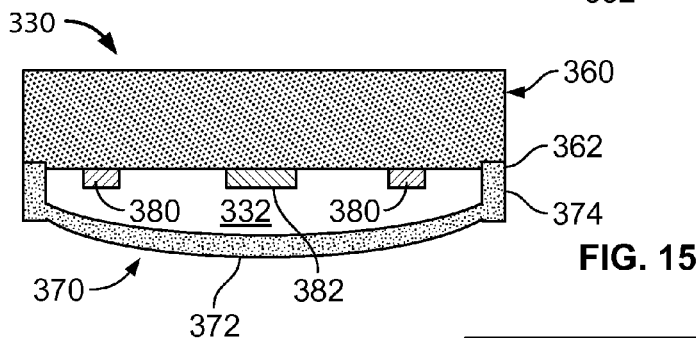
FIG. 15 is a cross section of the single side polishing head of FIG. 12 with a pressurized section under polishing pressure 0.9 P.

As shown in FIG. 14, under a given or predetermined polishing pressure P, the floor 372 is deflected to be substantially flat, resulting in a removal profile that is also substantially flat. As shown in FIG. 15, reducing the polishing pressure 0.9 P causes both the floor 372 and the removal profile to become downwardly curved.

Stopper ring 380 and center stopper 382 limit the upward deflection of the floor 372. The stopper ring 380 is spaced inward from the outer circumference and is annular in shape. The center stopper 382 is co-axially aligned with the polishing head 360, the cap 370, and the stopper ring 380. With additional reference to FIG. 12, the stopper ring 380 and the center stopper 382 extends from the bottom surface of the polishing head 360 to an inner or top surface of the floor 372. The height of the stopper ring 380 and the center stopper 382 are substantially equivalent to the between the polishing head 360 and the floor 372.

With reference to FIGS. 15-18, the height of each the stopper ring 380 and the center stopper 382 may be adjusted to vary the deflection shape of the floor 372.

Figure 16:
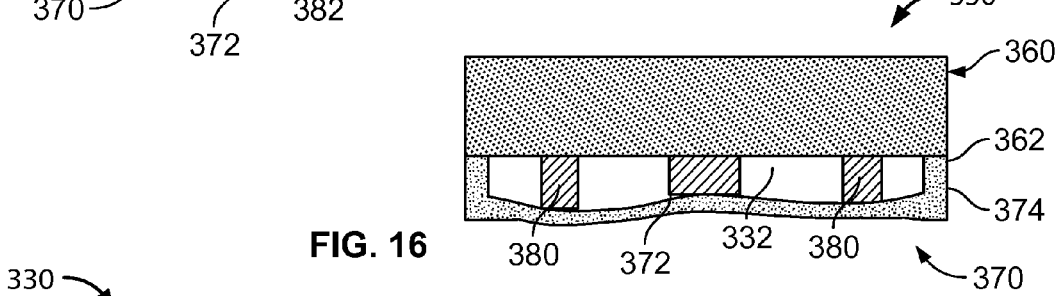
FIG. 16 is a cross section of the single side polishing head of FIG. 12 with a center stopper retracted and a pressurized section under polishing pressure 1.3 P.
Figure 17:
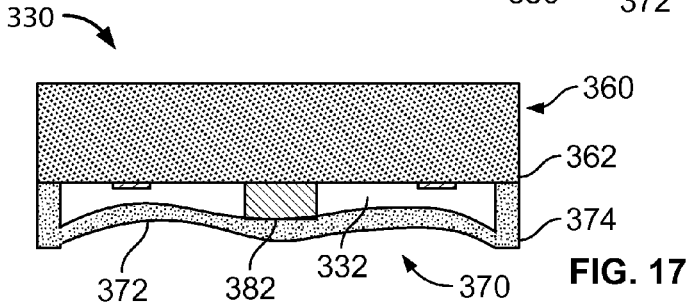
FIG. 17 is a cross section of the single side polishing head of FIG. 12 with stopper ring retracted and a pressurized section under polishing pressure 1.3 P.
Figure 18:
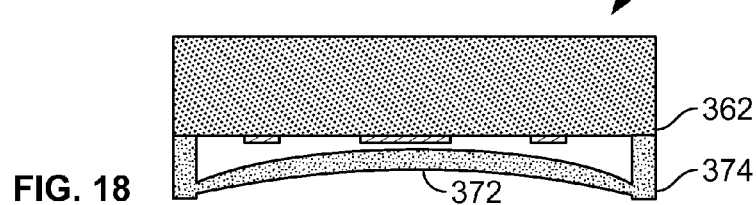
FIG. 18 is a cross section of the single side polishing head of FIG. 12 with both stoppers retracted and a pressurized section under polishing pressure 1.1 P.

As shown in FIG. 16, reducing the height of the center stopper 382 and increasing the polishing pressure 1.3 P causes both the shape of the floor 372 and the removal profile to become w-shaped. As shown in FIG. 17, reducing the height of the stopper ring 380 and increasing the polishing pressure 1.3 P causes both the shape of the floor 372 and the removal profile to become m-shaped. As shown in FIG. 18, reducing the height of both the stopper ring 380 and the center stopper 382, and increasing the polishing pressure 1.1 P causes both the shape of the floor 372 and the removal profile to become domed. Thus, a change in polishing pressure provides the operator with the ability to adjust the polished shape of the wafer W.

Figure 19:
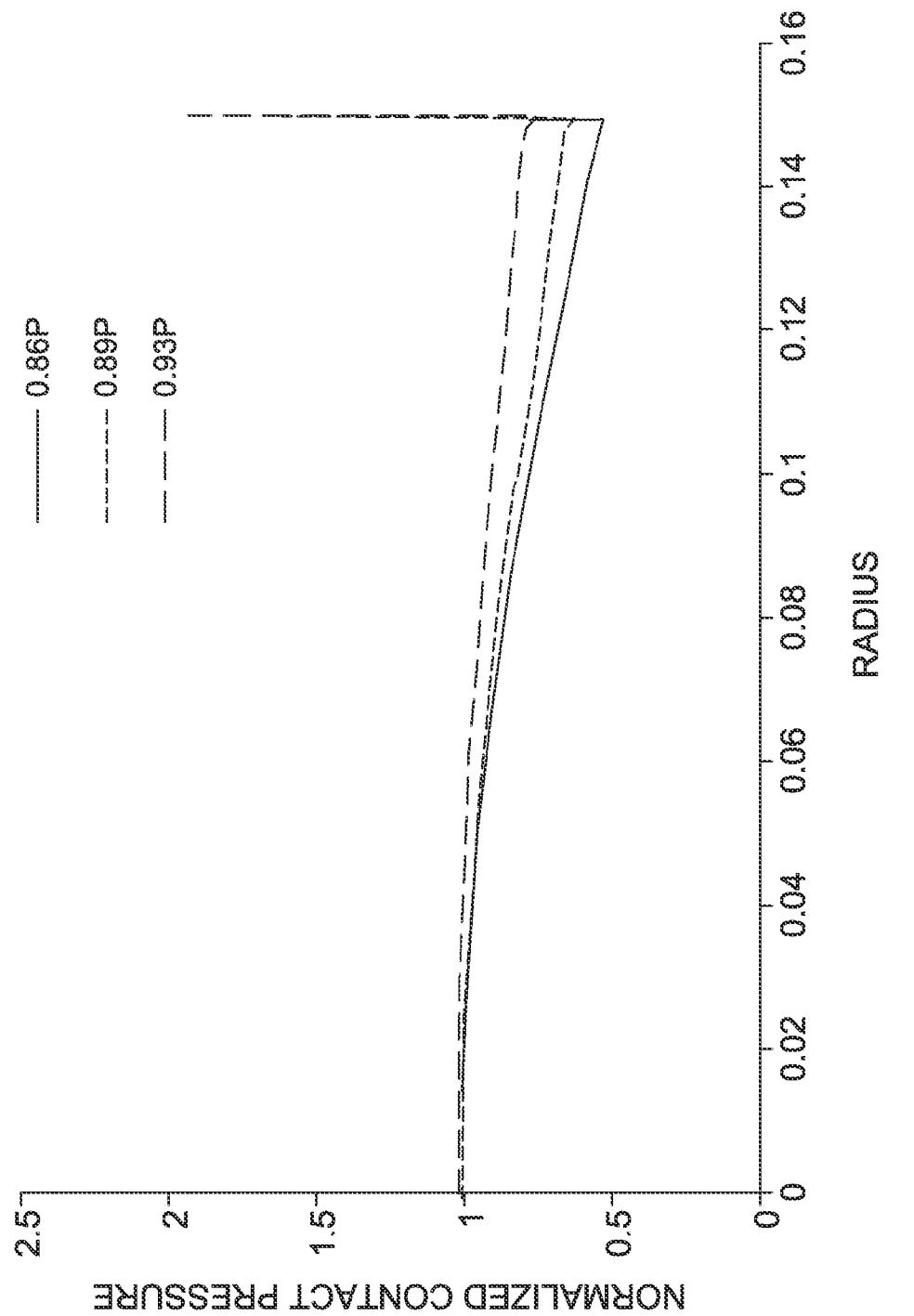
FIG. 19 is a Doming Correction graph plotting the correlation of the contact pressure and the radius.
Figure 20:
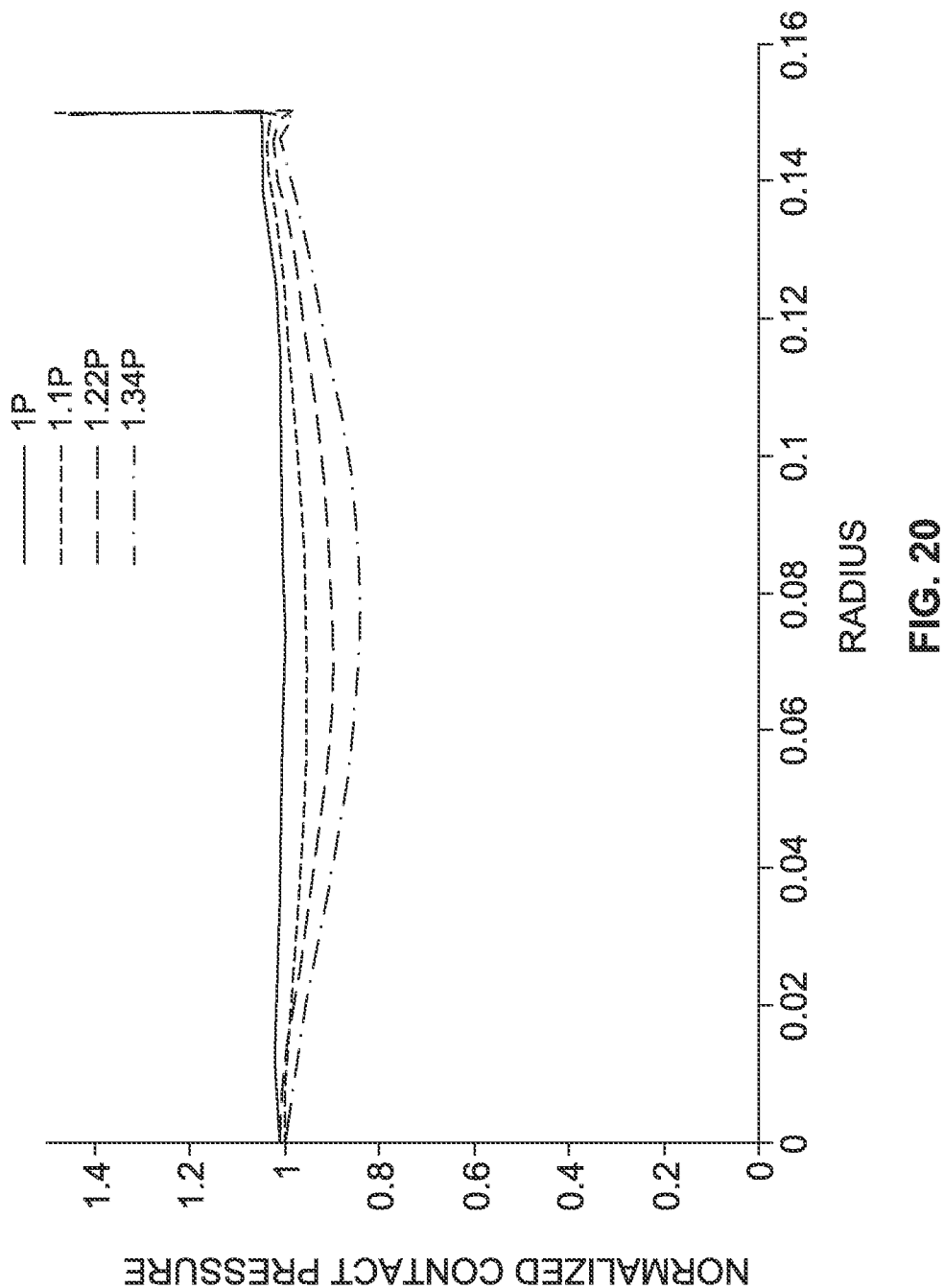
FIG. 20 is a Negative W-factor Correction graph plotting the correlation of the contact pressure and the radius.

Finite element simulation results illustrating this embodiment's ability to modulate contact pressure profiles for adjusting doming and w-shape wafer profiles are shown in FIGS. 19 and 20. FIG. 19 is a doming correction graph that plots the correlation of the contact pressure and the radius in accordance with the embodiment above is shown. FIG. 20 is a negative w-factor correction graph that plots the correlation of contact pressure and the radius in accordance with the embodiment above is shown.

Figure 21:
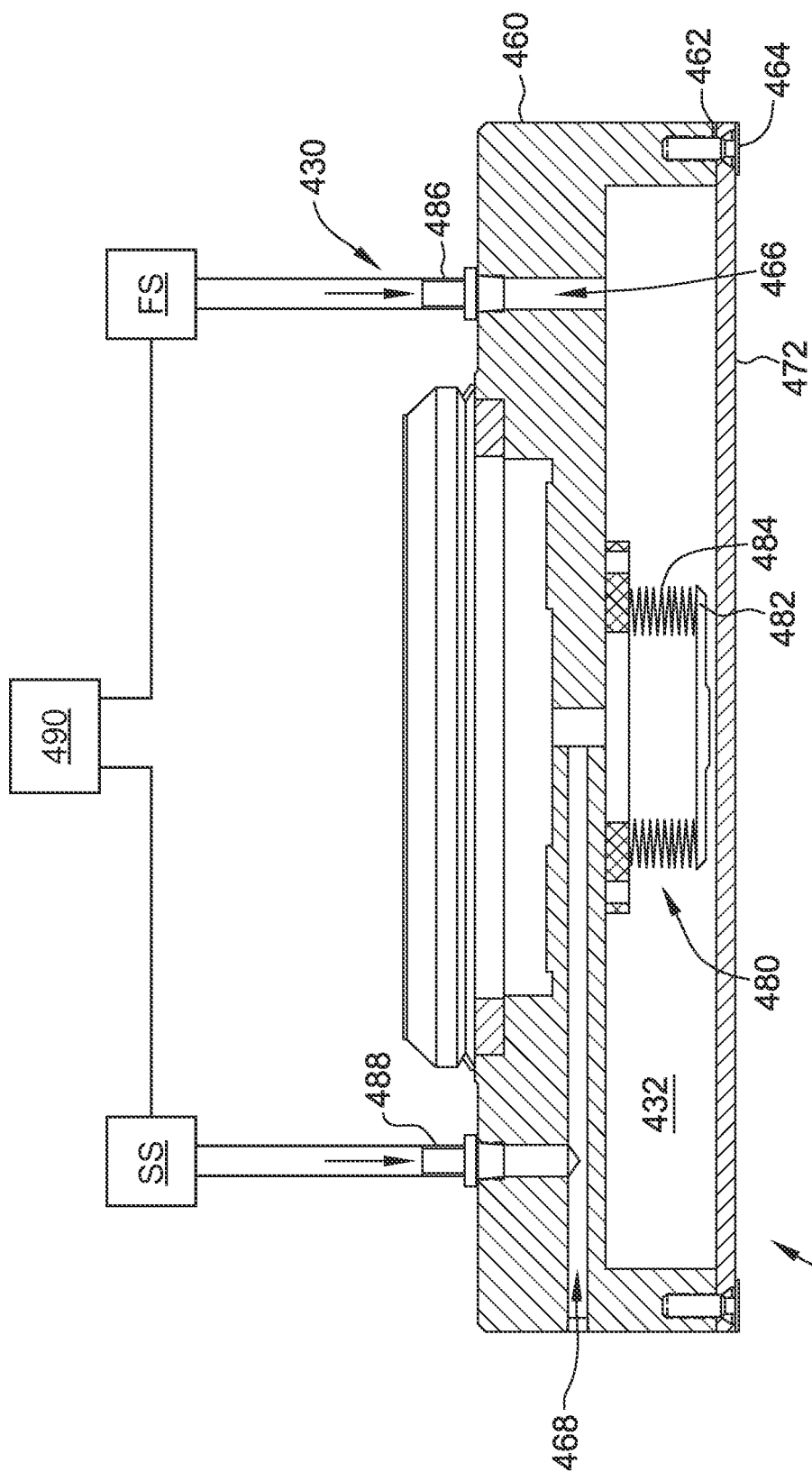
FIG. 21 is a cross section of a single side polishing head with a flat plate and an inflatable bellow attached to a center stopper in accordance with another embodiment.

With reference to FIG. 21, another embodiment of the polishing head assembly 430 is adapted to adjust pressure distribution to a wafer during the polishing process for controlling or minimizing doming, dishing, and w-shape cross section of the wafer.

The polishing head assembly 430 has a polishing head 460, a cap 470, and a center stopper 480. The cap 470 includes a floor 472 that is rigidly attached to edges 462 of the polishing head 460 with screws 464 and extends across the edges to form a chamber 432 between the floor and the polishing head. In other embodiments, an adhesive is used to attach the floor 472 to the edges 462 of the polishing head 460, instead of screws 464. The floor 472 is substantially flat in an initial or un-deflected state. The chamber 432 is connected with a first pressurizing source FS through a chamber passageway 466 and connector 486 to provide a pressurizing fluid to the chamber 432 that may cause the floor 472 to deflect into a downward dome shape, similar to floors 172, 272, and 372.

Similar to the floors 172, 272, and 372, the floor 472 of the cap 470 is adapted to temporarily deflect in a direction that is perpendicular to the polishing surface as the polishing pressure is increased. The cap 470 is not permanently deflected or deformed by the pressure. The floor 472 has the ability to transition from a pressurized deflected or downwardly curved shape to a flat shape that is substantially parallel with a bottom surface of the polishing head 460, and finally to an upwardly curved or convex shape based on the amount of pressurizing fluid supplied to the chamber 432.

Under a given or predetermined polishing pressure P, the floor 472 is deflected to be substantially flat, resulting in a removal profile that is also substantially flat. Reducing the polishing pressure 0.9 P causes both the floor 472 and the removal profile to become downwardly curved.

The center stopper 480 includes a stop 482 connected with inflatable bellows 484. The bellow 484 is connected with and extends into the chamber 432 from the polishing head 460. The height of the stop 482 is adjusted by increasing or decreasing the pressure within the bellows 484, which is connected with a second pressurizing source SS through a center passageway 468 and a connector 488. Adjustment of the pressure within the bellows 484 may either limit the upward deflection of the floor 472 or to deflect the floor 472 outward. The first and second pressurizing sources FS and SS may be connected through a controller 490 to respective connectors 486 and 488. In some embodiments, first and second pressurizing sources FS and SS are the same pressurizing source and are connected with the respective connectors 486 and 488 through the controller 490, which may include a divider and control valves (not shown). In some embodiments, the polishing head assembly 430 does not include a center stopper 480. In these embodiments, the first pressurizing source FS may be supplied to the chamber 432 through the center of the polishing head 460.

The center stopper 480 is co-axially aligned with both the polishing head 460 and the cap 470. During operation, the center stopper 482 may extend from the bottom surface of the polishing head 460 to an inner or top surface of the floor 472, such that the height of the center stopper 480 is substantially equivalent to the chamber between the polishing head 460 and the floor 472.

Figure 22:
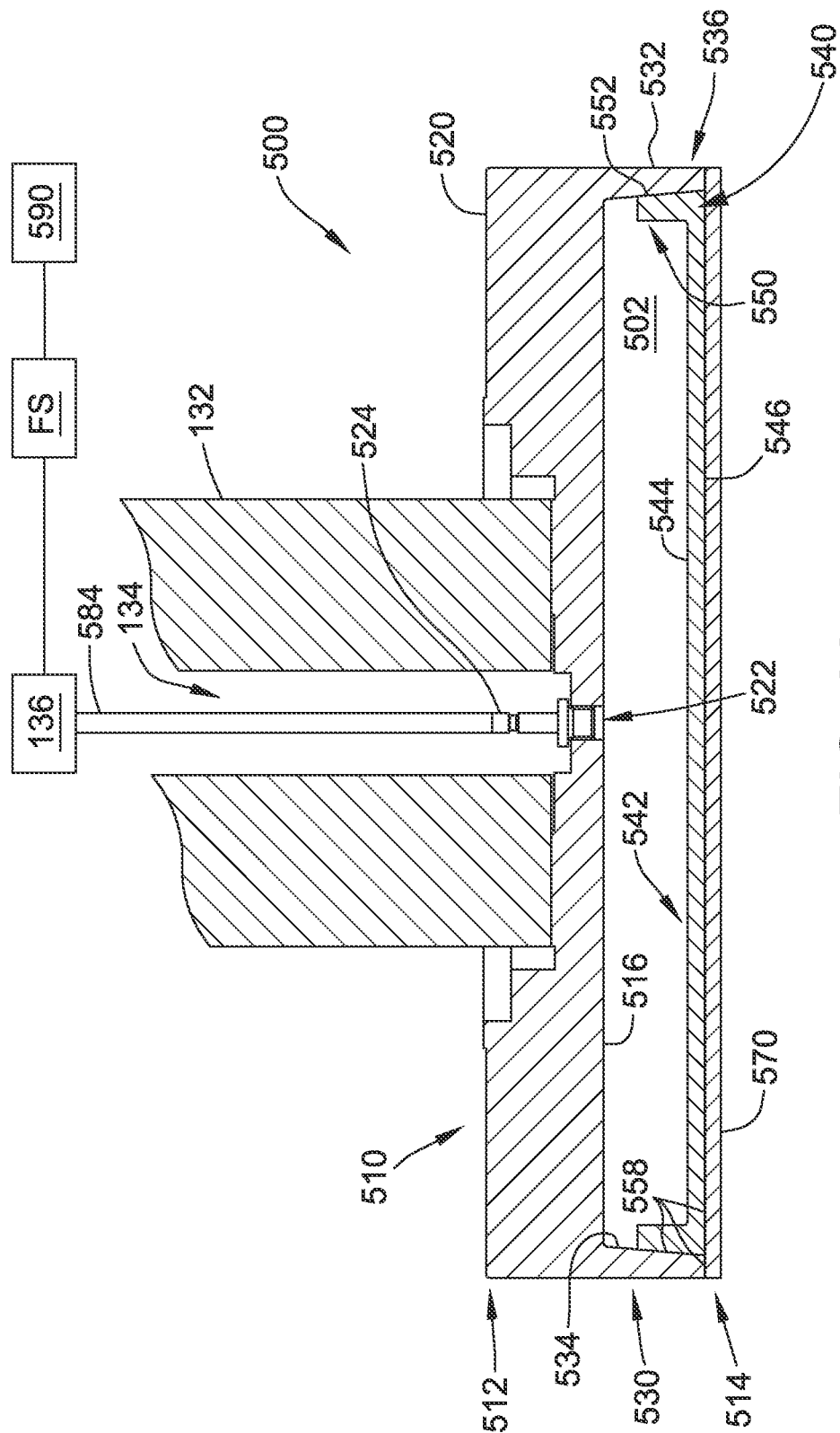
FIG. 22 is a cross section of a single side polishing head with a protective sheet attached to a bottom surface in accordance with another embodiment.

With reference to FIG. 22, another embodiment of a polishing head assembly 500 for attachment to the polishing apparatus 100 is shown. The polishing head assembly 500 is attached to a spindle 132 of the polishing apparatus 100. The spindle 132 is a tube with a center passage 134. The center passage 134 opens to the polishing head assembly 500 at one end and is connected with a rotary connector 136 at the other end.

The polishing apparatus 100 and polishing head assembly 500 are adapted to adjust the magnitude and distribution of pressure applied to the wafer during the polishing process to control or minimize doming, dishing, and m/w-shape cross section of the wafer. Adjusting the magnitude and distribution of pressure applied to the wafer allows the amount and location of wafer material removal to be regulated. As discussed above, both the magnitude and distribution of pressure applied to the wafer may be adjusted by increasing or decreasing the force at which the polishing head assembly 500 is pushed downward or against the wafer. The magnitude and distribution of pressure applied to the wafer may also be varied by adjusting pressure in a chamber 502 located within the polishing head assembly 500. The chamber 502 may include one or more pressurized areas. In embodiments that have multiple pressurized areas, the same or different pressures may be supplied to each of the different pressurized areas. This ability to adjust the magnitude and distribution of pressure applied to the wafer provides a control mechanism to remove more or less wafer material from one section of the wafer than another. As a result, by adjusting the amount and location of material removal, the resulting polished profile of the wafer may be controlled.

The wafer is attached to and retained against the polishing head assembly 500 by surface tension. To form the surface tension, the wet saturated backing film 110 of FIG. 1 is attached to the polishing head assembly 500 with a pressure sensitive adhesive. The backing film 110 and retaining ring 120 form a "wafer holding template." The backing film 110 is generally a soft polymer pad or other suitable material.

The wafer is then pressed into the wet saturated backing film 110 to remove or squeeze out the majority of the water or other suitable liquid. Squeezing out the water causes the wafer to be retained on the backing film 110 by surface tension and the atmospheric pressure on the exposed surface of the wafer. This squeezing out of the water mounts the wafer to the polishing head assembly 500.

As discussed in more detail below, a portion of the polishing head assembly 500 is flexible enough to deform in response to a change in pressure applied to either the polishing head or chamber 502, and stiff enough not to deform when the wafer is pressed into the wet saturated template. The surface tension provides a constant retaining force over the surface of the wafer. This constant retaining force causes any deformation of the polishing head assembly 500 adjacent to the wafer to be directly translated into proportional deformation of the wafer providing a direct connection between the pressure in the chamber and the polishing profile.

This retention of the wafer by surface tension functions differently than other known mechanisms that use flexible membranes or vacuums to retain the wafer against the polishing head assemblies. Flexible membranes, as known in the art, deform to create space or vacuum pockets between the wafer and the flexible membrane when the wafer is pushed thereon. These vacuum pockets allow the membrane to pick up the wafer. Other membranes have vacuum holes, which are connected to a vacuum to create low pressure areas to pick up wafers.

The polishing head assembly 500 includes a polishing head 510, a cap 540, and a protective sheet 570. The polishing head 510 has a top 512 and a bottom 514 that are substantially parallel with each other. The top 512 of the polishing head 510 is connected with the spindle 132. The polishing head 510 has a platform 520 and a cylindrical member 530 extending downward from the platform. A recessed surface 516 is formed in the bottom 514 of the polishing head 510 by the cylindrical member 530 protruding from the platform 520.

The cylindrical member 530 has an outside surface 532 that is substantially perpendicular to the top 512 and bottom 514 of the polishing head 510. The outside surface 532 of the cylindrical member 530 forms the circumference of both the polishing head 510 and the polishing head assembly 500. The cylindrical member 530 has an inside surface 534 that is angled with respect to the outer surface such that the cylindrical member is thinnest along its bottom portion 536. This tapering of the cylindrical member 530 provides a stiffer top section adjacent the platform 520.

The cap 540 has a floor 542 and an upwardly extending annular wall 550 along the perimeter of the floor. The annular wall 550 has an outer surface 552 that mates with the inside surface 534 of the cylindrical member 530. As such, the outer surface 552 of the annular wall 550 is also angled to match the inside surface 534 of the cylindrical member 530.

In some embodiments, the inside surface 534 of the cylindrical member 530 and the outside surface 532 of the annular wall 550 are parallel with a longitudinal axis defined by the center passage 134 of the spindle 132. This longitudinal axis is concentric with and extends through a rotational center of the polishing head assembly 500.

In other embodiments, the annular wall 550 is attached to the outer surface of the cylindrical member 530. In these embodiments, a pressurized chamber 502 exerts a downward pressure on the floor 542 of the cap 540. The moment of this downward force is translated around to the annular wall 550 causing it to react against or squeeze the cylindrical member 530.

The floor 542 extends across an opening formed by the cylindrical member 530 at the bottom 514 of the polishing head 510. The floor 542 is substantially flat in an initial or un-deflected state and is deformed by adjusting the pressure within the chamber 502. The pressurizing fluid may cause the floor 542 to deflect into a downward dome shape or upward dish shape, similar to the other floors of this disclosure. In some embodiments, an internal pressure of approximately 2 psi will cause a 150 to 200 μm deflection of the floor. In other embodiments, an internal pressure of approximately 2 psi will cause a 100 to 400 μm deflection of the floor.

The floor 542 of the cap 540 is a semi-rigid "flex plate" that is adapted to be precisely deformed to change the pressure distribution and polishing pressure profile, and still be rigid enough to mount and demount the wafer on the backing film 110. The rigidity of the floor 542 is such that it does not deform significantly during the mounting of the wafer on the polishing head assembly 500.

The chamber 502 is formed between a top surface 544 of the floor 542 of the cap 540 and the recessed surface 516 of the polishing head 510. The cylindrical member 530 and the annular wall 550 determine the radial boundaries of the chamber 502. The platform 520 and the overlapping cylindrical member 530 and annular wall 550 are thicker and are adapted to be more rigid than the floor 542. As such, adjusting the pressure within the chamber 502 causes deformation of the floor.

Similar to the other floors of this disclosure, floor 542 of the cap 540 is adapted to temporarily deflect in a direction that is perpendicular to the polishing surface as the polishing pressure is increased. The cap 540 is not permanently deflected or deformed by the pressure. The floor 542 has the ability to transition from a pressurized deflected or downwardly curved shape to a flat shape that is substantially parallel with a bottom surface of the polishing head 510, and finally to an upwardly curved or convex shape based on the amount of pressurizing fluid supplied to the chamber 502 and polishing pressure.

To mount the wafer on the polishing head assembly 500 the backing film 110 is attached on the bottom surface 546 of the floor 542. The wafer is then mounted on the backing film 110 and retained there by the above discussed "surface tension." This evenly distributed surface tension provides direct deformation of the wafer when the pressure in the chamber 502 is adjusted and the floor 542 is deformed. Increasing or decreasing the pressure within the chamber can cause the surface of the floor 542 and wafer to balloon outward, remain flat, or be drawn in.

To adjust the pressure within the chamber 502, it is connected with a first pressurizing source FS. A chamber passageway 522 extends through the platform 520 to connect the chamber 502 with a chamber connector 524, which may be a quick disconnect coupling plug. The chamber connector 524 is connected through a chamber supply line 584 to the rotary connector 136. The rotary connector 136 is connected with the first pressurizing source FS to supply a pressurizing fluid to and from the chamber 502 through the spindle 132. The first pressurizing source FS may provide a pneumatic supply for increasing or decreasing the pressure within the chamber 502 of the polishing head assembly 500.

The first pressurizing source FS may be connected with a controller 590 for monitoring and adjusting the pressure within the chamber 502. The controller 590 may include a pressure regulator (not shown). The pressure can be adjusted either manually, based on the general wafer shape of the incoming lot, or may be electronically controlled lot by lot, or even wafer by wafer. In some embodiments, a characteristic wafer profile is obtained from a lot of wafers, and the downward pressure applied to the wafer by the polishing head assembly and the distribution of that pressure is adjusted to maximize the flatness of a characteristic wafer.

Under a given or predetermined polishing pressure P; the floor 542 is substantially flat, resulting in a removal profile that is also substantially flat. Reducing the polishing pressure 0.9 P causes both the floor 542 and the removal profile to become upwardly curved. Increasing the polishing pressure 1.1 P causes both the floor 542 and the removal profile to become downwardly curved.

The outer surface 552 of the annular wall 550 is attached to the inside surface 534 of the cylindrical member 530 of the polishing head 510 with an adhesive 558 along a bond line. The adhesive is continuous and forms a seal between the outer surface 552 and inside surface 534. The adhesive may be an epoxy glue. The bond line is at an angle with the recessed surface 516 and direction of deflection of the floor 542.

As discussed above, the outer surface 552 and the inside surface 534 are angled. This angle acts as an assembly aid to prevent the adhesive from being scraped off during assembly. The optimum lay thickness for the adhesive is between 0.15 and 0.20 mm.

The use of adhesives simplifies both the fabrication of the polishing head assembly and the process of lapping the surfaces flat. Another benefit is that the adhesive also adds a degree of flexibility to the cap 540 that allows the floor 542 to flex as a smooth dome or dish. The ability of the adhesive to flex helps provide a smooth, curved deflection and minimize the edge effect.

Use of the glued together polishing head assemblies of these embodiments have several advantages over the use of screwed together polishing head assemblies, such as discussed above and shown in FIG. 21. For example, only one surface of the cap 540 requires lapping. Three surfaces must be lapped in an embodiment that has a cap attached with screws. Also, the orientation of the cap does not need to be maintained like it does in embodiments with a screwed on cap.

In addition, the deformation of the floor of the glued together polishing assembly evenly distributes the bending stresses. However, the deformation of the floor of screwed together polishing head assemblies is dependent on the torque used to apply the screws. The use of screws causes non-uniformity on the backside of the floor in the locations where the screws are placed by causing these locations to be stiffer than the rest of the plate. The stiffer screw locations lead to non-uniform bending stresses in the plate during lapping, and during the polishing process, which result in a plate that is not uniformly flat.

The polishing head 510 and cap 540 may be made of a metal, such as steel, aluminum, or another suitable metallic material. In some embodiments, the polishing head 510 and cap 540 are made of cast aluminum (for example, MIC6® Aluminum Cast Plate available from Alcoa.) In other embodiments, the cap 540 may be made of a ceramic, such as alumina, or plastic material. In embodiments that use a plastic material, a polyetherimide (for example, ULTEM™ Resin 1000 available from Saudi Basic Industries Corporation (SABIC)) may be used. A plastic cap 540 is substantially thicker than one made with either metal or ceramic. Caps made with a ceramic material have substantially thinner floors than those made with either metal or plastic.

Metal used in the polishing head assembly 500 has the potential to contaminate the wafer by being a source of metal ions through the polishing chemicals or slurry. To prevent metal from the polishing head 510 from contaminating the slurry and the wafer, the polishing head 510 is coated with epoxy, fluorocarbon, or another suitable, non-metallic material to create a barrier to provide metal ion protection. To prevent the metal from cap 540 from contaminating the slurry and the wafer, the protective sheet 570 may be used to create a barrier between the slurry and the cap 540. The protective sheet 570 prevents the slurry from contacting the cap 540 and contaminating the slurry and the wafer during the polishing process.

The protective sheet 570 is attached to and extends along the bottom 514 of the polishing head 510 and the bottom surface 546 of the cap 540 with an adhesive. In some embodiments, the protective sheet 570 is formed by lamination on the bottom surface 546 of the cap 540. As shown, the protective sheet 570 extends past the bottom surface 546 of the cap 540 to form a seal with the bottom 514 of the polishing head 510. Protective sheet 570 is made of plastic, such as polyetherimide (for example, ULTEM™ Resin 1000 available from Saudi Basic Industries Corporation (SABIC)).

Figure 23:
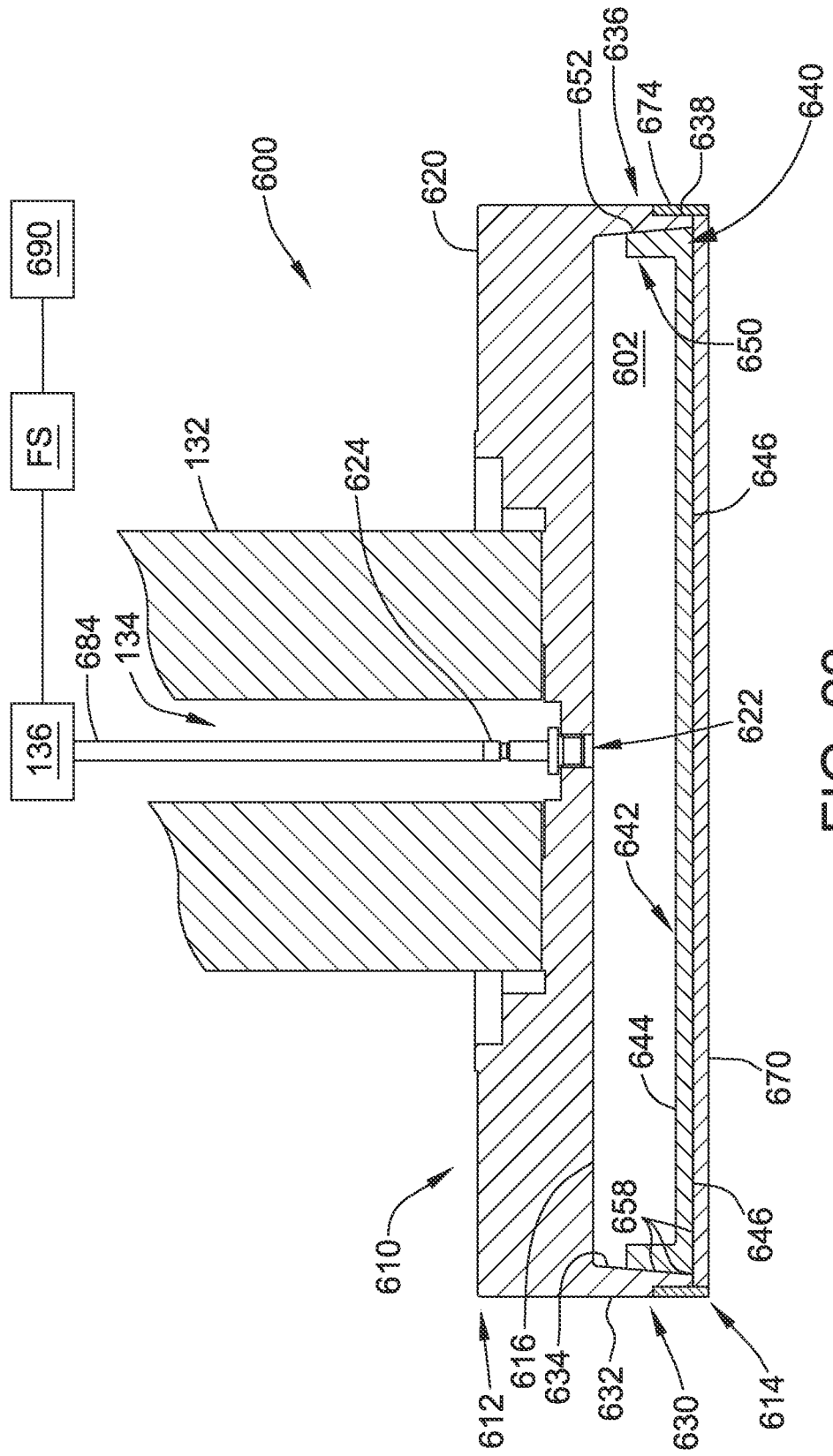
FIG. 23 is a cross section of a single side polishing head with a protective sheet and a band in accordance with another embodiment.

With reference to FIG. 23, another embodiment of a polishing head assembly 600 for attachment to the polishing apparatus 100 is shown. The polishing head assembly 600 is attached to the spindle 132 of the polishing apparatus 100. The spindle 132 is a tube with a center passage 134. The center passage 134 opens to the polishing head assembly 600 at one end and is connected with a rotary connector 136 at the other end.

The polishing apparatus 100 and polishing head assembly 600 are adapted to adjust the magnitude and distribution of pressure applied to the wafer during the polishing process to control or minimize doming, dishing, and m/w-shape cross section of the wafer. The magnitude and distribution of pressure applied to the wafer may be varied by adjusting pressure in a chamber 602 located within the polishing head assembly 600. The chamber 602 may include one or more pressurized areas.

The polishing head assembly 600 includes a polishing head 610, a cap 640, a protective sheet 670, and a band 674. In some embodiments, the protective sheet 670 may be omitted. The polishing head 610 has a top 612 and a bottom 614 that are substantially parallel with each other. The top 612 of the polishing head 610 is connected with the spindle 132. The polishing head 610 has a platform 620 and a cylindrical member 630 extending downward from the platform. A recessed surface 616 is formed in the bottom 614 of the polishing head 610 by the cylindrical member 630 protruding from the platform 620.

The cylindrical member 630 has an outside surface 632 that is substantially perpendicular to the top 612 and bottom 614 of the polishing head 610. The outside surface 632 of the cylindrical member 630 forms the circumference of both the polishing head 610 and the polishing head assembly 600. The cylindrical member 630 has an inside surface 634 that is angled with respect to the outer surface such that the cylindrical member is thinnest along its bottom portion 636. This tapering of the cylindrical member 630 provides a stiffer top section adjacent the platform 620.

The cap 640 has a floor 642 and an upwardly extending annular wall 650 along the perimeter of the floor. The annular wall 650 has an outer surface 652 that mates with the inside surface 634 of the cylindrical member 630. As such, the outer surface 652 of the annular wall 650 is also angled to match the inside surface 634 of the cylindrical member 630.

The floor 642 extends across an opening formed by the cylindrical member 630 at the bottom 614 of the polishing head 610. The floor 642 may be substantially flat in an initial or un-deflected state and deformed by adjusting the pressure within the chamber 602. The floor 642 of the cap 640 is a semi-rigid "flex plate" that is adapted to be precisely deformed to change the pressure distribution and polishing pressure profile, and still be rigid enough to mount and demount the wafer on the backing film 110 by surface tension. The rigidity of the floor 642 is such that it does not deform during the mounting of the wafer on the polishing head assembly 600.

The chamber 602 is formed between a top surface 644 of the floor 642 of the cap 640 and the recessed surface 616 of the polishing head 610. The cylindrical member 630 and the annular wall 650 determine the radial boundaries of the chamber 602. The platform 620 and the overlapping cylindrical member 630 and annular wall 650 are thicker and are adapted to be more rigid than the floor 642.

Similar to the other floors of this disclosure, floor 642 of the cap 640 is adapted to temporarily deflect in a direction that is perpendicular to the polishing surface as the polishing pressure is increased. The cap 640 is not permanently deflected or deformed by the pressure. The floor 642 also has the ability to transition from a pressurized deflected or downwardly curved shape to a flat shape that is substantially parallel with a bottom surface of the polishing head 610, and finally to an upwardly curved or convex shape based on the amount of pressurizing fluid supplied to the chamber 602 and polishing pressure.

To mount the wafer on the polishing head assembly 600 the backing film 110 is attached on the bottom surface 646 of the floor 642. The wafer is then mounted on the backing film 110 and retained there by the above discussed "surface tension." This evenly distributed surface tension provides direct deformation of the wafer when the pressure in the chamber 602 is adjusted and the floor 642 is deformed. Increasing or decreasing the pressure within the chamber can cause the surface of the floor 642 and wafer to balloon outward, remain flat, or be drawn in.

To adjust the pressure within the chamber 602, it is connected with a first pressurizing source FS. A chamber passageway 622 extends through the platform 620 to connect the chamber 602 with a chamber connector 624, which may be a quick disconnect coupling plug. The chamber connector 624 is connected through a chamber supply line 684 to the rotary connector 136. The rotary connector 136 is connected with the first pressurizing source FS to supply a pressurizing fluid to and from the chamber 602 through the spindle 132. The first pressurizing source FS may provide a pneumatic supply for increasing or decreasing the pressure within the chamber 602 of the polishing head assembly 600.

The first pressurizing source FS may be connected with a controller 690 for monitoring and adjusting the pressure within the chamber 602. The controller 690 may include a pressure regulator (not shown). The pressure can be adjusted either manually, based on the general wafer shape of the incoming lot, or may be electronically controlled lot by lot, or even wafer by wafer. In some embodiments, a characteristic wafer profile is obtained from a lot of wafers, and the downward pressure applied to the wafer by the polishing head assembly and the distribution of that pressure is adjusted to maximize the flatness of a characteristic wafer.

The outer surface 652 of the annular wall 650 is attached to the inside surface 634 of the cylindrical member 630 of the polishing head 610 with an adhesive 658 along a bond line. The adhesive may be an epoxy glue. The bond line is at an angle with the recessed surface 616 and direction of deflection of the floor 642.

The polishing head 610 and cap 640 may be made of a metal, such as steel, aluminum, or another suitable metallic material. In some embodiments, the polishing head 610 and cap 640 are made of cast aluminum (for example, MIC6® Aluminum Cast Plate available from Alcoa.) In other embodiments, the cap 640 may be made of a ceramic, such as alumina, or plastic material. In embodiments that use a plastic material, a polyetherimide (for example, ULTEM™ Resin 1000 available from Saudi Basic Industries Corporation (SABIC)) may be used. A plastic cap 640 is substantially thicker than one made with either metal or ceramic. Caps made with a ceramic material have substantially thinner floors than those made with either metal or plastic.

Metal used in the polishing head assembly 600 has the potential to contaminate the wafer by being a source of metal ions through the polishing chemicals or slurry. To prevent the metal from cap 640 from contaminating the slurry and the wafer, the protective sheet 670 may be used to create a barrier between the slurry and the cap 640. The protective sheet 670 prevents the slurry from contacting the cap 640 and contaminating the slurry and the wafer during the polishing process. The protective sheet 670 is attached to and extends along the bottom 614 of the polishing head 610 and the bottom surface 646 of the cap 640 with an adhesive. As shown, the protective sheet 670 extends past the bottom surface 646 of the cap 640 to form a seal with the bottom 614 of the polishing head 610.

To prevent metal from the polishing head 610 from contaminating the slurry and the wafer, the polishing head 600 is circumscribed with the band 674 forming a barrier to prevent the slurry from contacting the metal and contaminating the wafer. The cylindrical member 630 has a side recess 638 that extends inward from the outside surface 632 along its bottom portion 636. The band 674 overlaps the protective sheet 670 to form a seal therebetween to prevent metal contamination of the polishing process from the polishing head 610. The band 674 and the protective sheet 670 are made of plastic, such as polyetherimide (for example, ULTEM™ Resin 1000 available from Saudi Basic Industries Corporation (SABIC)).

Figure 24:
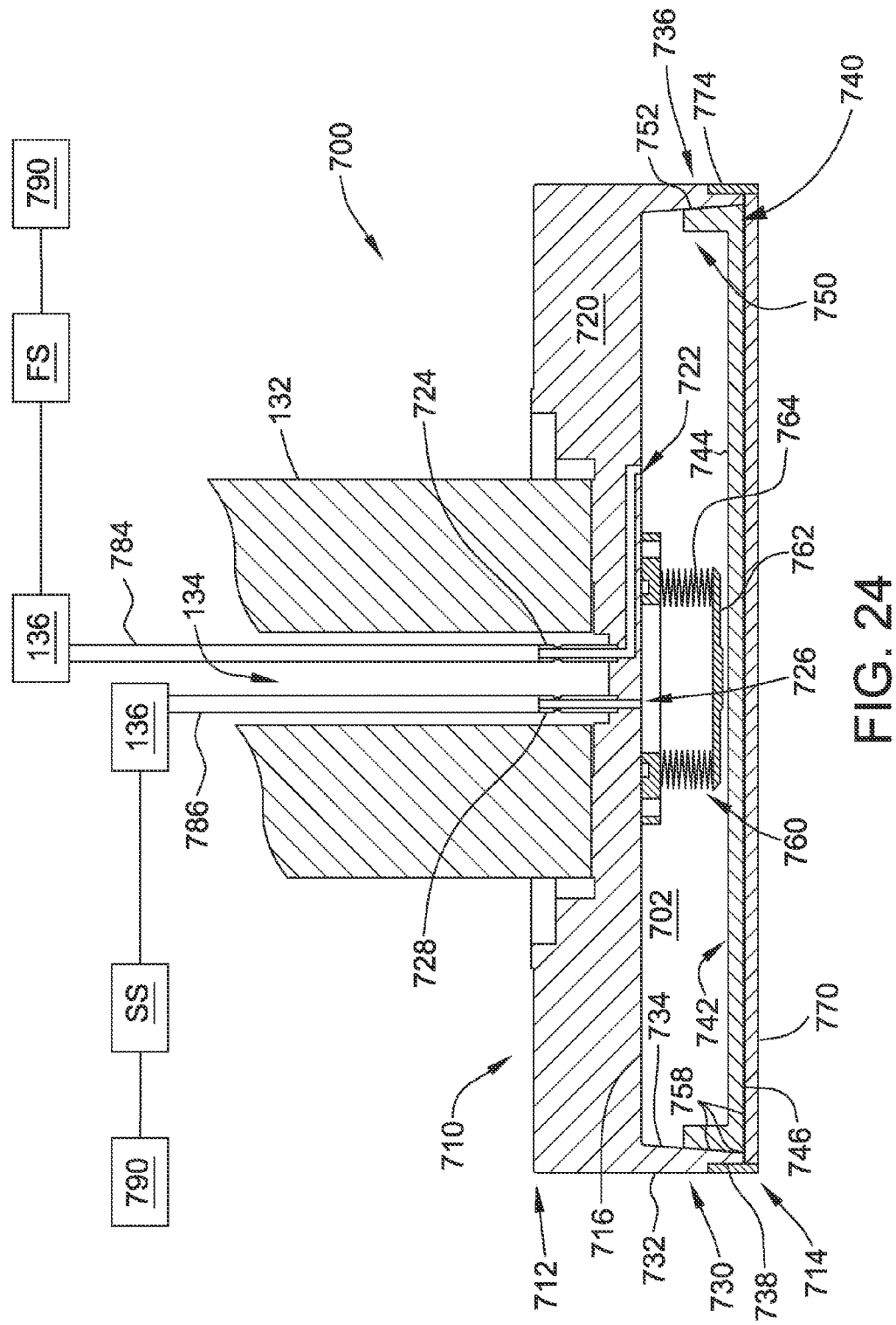
FIG. 24 is a cross section of a single side polishing head with a protective sheet, a band, and a center stopper in accordance with another embodiment.

With reference to FIG. 24, another embodiment of a polishing head assembly 700 for attachment to the polishing apparatus 100 is shown. The polishing head assembly 700 is attached to a spindle 132 of the polishing apparatus 100. The spindle 132 is a tube with a center passage 134. The center passage 134 opens to the polishing head assembly 700 at one end and is connected with a rotary connector 136 at the other end.

The polishing apparatus 100 and polishing head assembly 700 are adapted to adjust the magnitude and distribution of pressure applied to the wafer during the polishing process to control or minimize doming, dishing, and m/w-shape cross section of the wafer. The magnitude and distribution of pressure applied to the wafer may be varied by adjusting pressure in a chamber 702 located within the polishing head assembly 700. The chamber 702 may include one or more pressurized areas.

The polishing head assembly 700 includes a polishing head 710, a cap 740, a center stop 760, a protective sheet 770, and a band 774. In some embodiments, the protective sheet 770 may be omitted. The polishing head 710 has a top 712 and a bottom 714 that are substantially parallel with each other. The top 712 of the polishing head 710 is connected with the spindle 132. The polishing head 710 has a platform 720 and a cylindrical member 730 extending downward from the platform. A recessed surface 716 is formed in the bottom 714 of the polishing head 710 by the cylindrical member 730 protruding from the platform 720.

The cylindrical member 730 has an outside surface 732 that is substantially perpendicular to the top 712 and bottom 714 of the polishing head 710. The outside surface 732 of the cylindrical member 730 forms the circumference of both the polishing head 710 and the polishing head assembly 700. The cylindrical member 730 has an inside surface 734 that is angled with respect to the outer surface such that the cylindrical member is thinnest along its bottom portion 736. This tapering of the cylindrical member 730 provides a stiffer top section adjacent the platform 720.

The cap 740 has a floor 742 and an upwardly extending annular wall 750 along the perimeter of the floor. The annular wall 750 has an outer surface 752 that mates with the inside surface 734 of the cylindrical member 730. As such, the outer surface 752 of the annular wall 750 is also angled to match the inside surface 734 of the cylindrical member 730.

The floor 742 extends across an opening formed by the cylindrical member 730 at the bottom 714 of the polishing head 710. The floor 742 may be substantially flat in an initial or un-deflected state and deformed by adjusting the pressure within the chamber 702. The floor 742 of the cap 740 is a semi-rigid "flex plate" that is adapted to be precisely deformed to change the pressure distribution and polishing pressure profile, and still be rigid enough to mount and demount the wafer on the backing film 110 by surface tension. The rigidity of the floor 742 is such that it does not deform during the mounting of the wafer on the polishing head assembly 700.

The chamber 702 is formed between a top surface 744 of the floor 742 of the cap 740 and the recessed surface 716 of the polishing head 710. The cylindrical member 730 and the annular wall 750 determine the radial boundaries of the chamber 702. The platform 720 and the overlapping cylindrical member 730 and annular wall 750 are thicker and are adapted to be more rigid than the floor 742.

Similar to the other floors of this disclosure, floor 742 of the cap 740 is adapted to temporarily deflect in a direction that is perpendicular to the polishing surface as the polishing pressure is increased. The cap 740 is not permanently deflected or deformed by the pressure. The floor 742 also has the ability to transition from a pressurized deflected or downwardly curved shape to a flat shape that is substantially parallel with a bottom surface of the polishing head 710, and finally to an upwardly curved or convex shape based on the amount of pressurizing fluid supplied to the chamber 702 and polishing pressure.

To mount the wafer on the polishing head assembly 700 the backing film 110 is attached on the bottom surface 746 of the floor 742. The wafer is then mounted on the backing film 110 and retained there by the above discussed "surface tension." This evenly distributed surface tension provides direct deformation of the wafer when the pressure in the chamber 702 is adjusted and the floor 742 is deformed. Increasing or decreasing the pressure within the chamber can cause the surface of the floor 742 and wafer to balloon outward, remain flat, or be drawn in.

To adjust the pressure within the chamber 702, it is connected with a first pressurizing source FS. A chamber passageway 722 extends through the platform 720 to connect the chamber 702 with a chamber connector 724, which may be a quick disconnect coupling plug. The chamber connector 724 is connected through a chamber supply line 784 to the rotary connector 136. The rotary connector 136 is connected with the first pressurizing source FS to supply a pressurizing fluid to and from the chamber 702 through the spindle 132. The first pressurizing source FS may provide a pneumatic supply for increasing or decreasing the pressure within the chamber 702 of the polishing head assembly 700.

The first pressurizing source FS may be connected with a controller 790 for monitoring and adjusting the pressure within the chamber 702. The controller 790 may include a pressure regulator (not shown). The pressure can be adjusted either manually, based on the general wafer shape of the incoming lot, or may be electronically controlled lot by lot, or even wafer by wafer. In some embodiments, a characteristic wafer profile is obtained from a lot of wafers, and the downward pressure applied to the wafer by the polishing head assembly and the distribution of that pressure is adjusted to maximize the flatness of a characteristic wafer.

The outer surface 752 of the annular wall 750 is attached to the inside surface 734 of the cylindrical member 730 of the polishing head 710 with an adhesive 758 along a bond line. The adhesive may suitably be an epoxy glue. Any adhesive that has a suitable bond strength for the materials, has the ability to operate under continuous load, and is resistant to the polishing chemicals may be used. The bond line is at an angle with the recessed surface 716 and direction of deflection of the floor 742.

The polishing head 710 and cap 740 may be made of a metal, such as steel, aluminum, or another suitable metallic material. In some embodiments, the polishing head 710 and cap 740 are made of cast aluminum (for example, MIC6® Aluminum Cast Plate available from Alcoa.) In other embodiments, the cap 740 may be made of a ceramic, such as alumina, or plastic material. In embodiments that use a plastic material, a polyetherimide (for example, ULTEM™ Resin 1000 available from Saudi Basic Industries Corporation (SABIC)) may be used. A plastic cap 740 is substantially thicker than one made with either metal or ceramic. Caps made with a ceramic material have substantially thinner floors than those made with either metal or plastic.

Metal used in the polishing head assembly 700 has the potential to contaminate the wafer by being a source of metal ions through the polishing chemicals or slurry. To prevent the metal from cap 740 from contaminating the slurry and the wafer, the protective sheet 770 may be used to create a barrier between the slurry and the cap 740. The protective sheet 770 prevents the slurry from contacting and reacting with the cap 740 and contaminating the slurry and the wafer during the polishing process. The protective sheet 770 is attached to and extends along the bottom 714 of the polishing head 710 and the bottom surface 746 of the cap 740 with an adhesive. As shown, the protective sheet 770 extends past the bottom surface 746 of the cap 740 to form a seal with the bottom 714 of the polishing head 710.

To prevent metal from the polishing head 710 from contaminating the slurry and the wafer, the polishing head 700 is circumscribed with the band 774 to prevent the slurry from contacting the metal and contaminating the wafer. The cylindrical member 730 has a side recess 738 that extends inward from the outside surface 732 along its bottom portion 736. The band 774 overlaps and is attached to the protective sheet 770 to form a seal therebetween to prevent metal contamination of the polishing process from the polishing head 710. The band 774 and the protective sheet 770 are made of plastic, such as polyetherimide (for example, ULTEM™ Resin 1000 available from Saudi Basic Industries Corporation (SABIC)).

In addition, the backing film 110 overlaps and is attached to at least a portion of both the protective sheet 770 and the band 774 to form the seal therebetween. As such, the seal forms a tortuous path between backing film 110, the protective sheet 770, and the band 774 to keep slurry from directly contacting the cap 740 and the polishing head 710.

The center stopper 760 includes a stop 762 connected with inflatable bellows 764. The bellow 764 is connected with and extends into the chamber 702 from the polishing head 710. The height of the stop 762 is adjusted by increasing or decreasing the pressure within the bellows 764, which is connected with a second pressurizing source SS through a center passageway 726, a chamber connector 728, a center supply line 786, and the rotary connector 136. In some embodiments, separate rotary connectors 136 are connected with each the chamber supply line 784 and the center supply line 786.

Adjustment of the pressure within the bellows 764 may either limit the upward deflection of the floor 742 or deflect the floor outward. The first and second pressurizing sources FS and SS may be connected through a controller 790 to respective connectors 724 and 728. In some embodiments, first and second pressurizing sources FS and SS are the same pressurizing source and are connected with the respective connectors 724 and 728 through the controller 790, which may include a divider and control valves (not shown). In some embodiments, the polishing head assembly 700 does not include a center stopper 760. In these embodiments, the first pressurizing source FS may be supplied to the chamber 702 through the center of the polishing head assembly 700. In some embodiments a pneumatic system is used to pressurize the polishing head assembly 700.

The center stopper 760 is co-axially aligned along the longitudinal axis with both the polishing head 710 and the cap 740. During operation, the center stopper 762 may extend from the bottom surface of the polishing head 710 to an inner or top surface of the floor 742, such that the height of the center stopper 760 is substantially equivalent to the chamber between the polishing head 710 and the floor 742.

In addition, the edge of the backing film 110 sticks to the band 774. This overlap forms a barrier that keeps chemicals from directly contacting the cap 740 or the polishing head 700.

In a method of one embodiment, a polishing process of a wafer is controlled by adjustment of the polishing pressure used in the polishing apparatus 100 to change the shape of a polishing head assembly to regulate the polished shape of a wafer W. In some embodiments, the polishing apparatus is a single side polisher. In another embodiment, the polishing pressure is regulated by a controller before or during the polishing process.

The method includes providing a polishing apparatus with a turntable for rotating a polishing pad in relation to the wafer and a polishing head assembly with a cap attached to a polishing side of a polishing head. The cap is moved with respect to the wafer to cause a polishing pressure from the wafer to react against the cap. The cap is deflected with respect to the polishing head. A liquid may be applied to the cap to wet it, such that the wafer is held in place, against the cap, by surface tension when the wafer is placed against it. The liquid on the lower surface of the cap can be squeezed to almost zero film thickness to retain the wafer by surface tension.

The polishing pressure reacting against the cap is adjusted to regulate the deflection of the cap for improving flatness of the polished surface. A surface of the wafer is polished by causing movement between the wafer and the polishing pad to form a polished surface on the wafer. An internal pressure within a chamber between the polishing head and the cap may be adjusted to regulate deflection of the cap with respect to the wafer for improving flatness of the polished surface.

Changing the shape of the cap from dish to dome or vice versa changes the material removal profile of the wafer and thus, changes the shape of the polished wafer. A domed head will cause more material removal in the center and thus make the wafer thickness profile dished relative to its thickness profile before polishing. While a dished head will remove more material on the edges of the wafer making the wafer domed relative to its thickness profile before polishing. In some embodiments, the shape of the polishing head may be changed by adding a low stiffness cap to the bottom of the existing head and then regulating the polishing pressure to deflect the cap to change its shape.

The embodiments described herein provide the ability to modulate the polishing head for doming, dishing, and +/− w-shape to enable an efficient and economical polishing method of processing semiconductor wafers. The method improves wafer yield and process capability, while reducing product tolerances and the time needed for maintenance associated with the replacement of the polishing pads and templates mounted on the single side polishing head.

Another advantage of using the embodiments described herein includes the ability of retrofitting a rigid ceramic head to have the capability of a flexible head in one or more radial areas, while retaining the standard load and unload method discussed above. The use of these embodiments are also more robust for wafer handling than a flexible membrane design. In addition, the cost of ownership and operation for a retrofit head should be lower than a flexible head having a membrane since replacing a template is significantly cheaper than replacing a membrane and rebuilding the membrane head.

Another advantage of using the embodiments described herein includes the ability to compensate for initially uneven wafer surfaces by modulating the shape of the polishing head.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A polishing head assembly for single side polishing of silicon wafers, the polishing head assembly comprising:
    a polishing head having a downwardly extending annular member defining a recess along a bottom portion of the polishing head, the annular member having an inner surface, the recess having a recessed surface; and
    a cap positioned within the recess, the cap having an annular wall and a floor extending across the annular wall, the floor being spaced from the recessed surface to form a chamber therebetween, the chamber configured to be pressurized for deflecting the floor, the annular wall being attached to the inner surface of the annular member along an outer surface of the annular wall with an adhesive.

2. The polishing head assembly of claim 1, wherein one of the polishing head and the cap is made of a metallic material and has a non-metallic barrier to prevent polishing chemicals from contacting and reacting with the metallic material.

3. The polishing head assembly of claim 2, wherein the metallic material is cast aluminum.

4. The polishing head assembly of claim 2, wherein the non-metallic barrier is a non-metallic coating.

5. The polishing head assembly of claim 2, wherein the non-metallic barrier is a band along an outside surface of the polishing head to prevent the polishing chemicals from contacting and reacting with the polishing head.

6. The polishing head assembly of claim 5, wherein the band is made of plastic.

7. The polishing head assembly of claim 5, further comprising a backing film, the backing film overlapping at least a portion of the band to form a seal therebetween.

8. The polishing head assembly of claim 2, wherein the non-metallic barrier is a protective sheet along a bottom surface of the cap to prevent the polishing chemicals from contacting and reacting with the cap.

9. The polishing head assembly of claim 8, wherein the protective sheet is attached to the polishing head assembly with an adhesive.

10. The polishing head assembly of claim 8, wherein the protective sheet is formed by lamination on the bottom surface of the cap.

11. The polishing head assembly of claim 8, wherein the protective sheet is plastic.

12. The polishing head assembly of claim 2, wherein the non-metallic barrier includes a band along an outside surface of the polishing head and a protective sheet along a bottom surface of the cap.

13. The polishing head assembly of claim 12, wherein the band and the protective sheet overlap and are attached to each other to form a seal therebetween.

14. The polishing head assembly of claim 13, further comprising a backing film, the band overlapping a portion of the protective sheet to form a seal therebetween, the backing film overlapping at least a portion of both the protective sheet and the band to form the seal in a tortuous path.

15. The polishing head assembly of claim 1, further comprising a stopper located within the chamber to cause or limit deformation of the floor.

16. The polishing head assembly of claim 1, further comprising a source of pressurized fluid for causing deflection of the cap.

17. The polishing head assembly of claim 16, further comprising a controller connected with the source of pressurized fluid to control deflection of the cap.

18. The polishing head assembly of claim 17, wherein the controller is configured to modulate the deflection of the cap on a wafer-by-wafer basis.

19. The polishing head assembly of claim 1, further comprising a backing film along a bottom portion of the polishing head assembly for use with a liquid to retain the wafer on the polishing head assembly by surface tension.

20. The polishing head assembly of claim 1, further comprising a liquid along a bottom portion of the polishing head assembly for retaining the wafer on the polishing head assembly by surface tension.

21. The polishing head assembly of claim 1, further comprising a wafer retained along a bottom portion of the polishing head assembly by surface tension.

22. A polishing head assembly for single side polishing of silicon wafers, the polishing head assembly comprising:
    a polishing head having a recess along a bottom portion, the recess having a recessed surface; and
    a cap positioned within the recess, the cap having an annular wall and a floor extending across the annular wall, the floor being spaced from the recessed surface to form a chamber therebetween, the chamber configured to be pressurized for deflecting the floor, the annular wall being attached to the polishing head with an adhesive, wherein the cap is made of aluminum.

* * * * *